(12) United States Patent
Murakami et al.

(10) Patent No.: US 8,314,630 B2
(45) Date of Patent: Nov. 20, 2012

(54) TEST SECTION UNIT, TEST HEAD AND ELECTRONIC DEVICE TESTING APPARATUS

(75) Inventors: Toru Murakami, Tokyo (JP); Hiroyuki Mineo, Tokyo (JP); Ju Hwan Yoo, Chungnam (KR)

(73) Assignee: Advantest Corporation, Tokyo (JP)

( * ) Notice: Subject to any disclaimer, the term of this patent is extended or adjusted under 35 U.S.C. 154(b) by 236 days.

(21) Appl. No.: 12/659,033

(22) Filed: Feb. 23, 2010

(65) Prior Publication Data

US 2010/0213959 A1    Aug. 26, 2010

Related U.S. Application Data

(60) Provisional application No. 61/202,373, filed on Feb. 24, 2009.

(51) Int. Cl.
  *G01R 31/00* (2006.01)
(52) U.S. Cl. ......... 324/756.07; 324/756.01; 324/756.02; 324/756.05
(58) Field of Classification Search .......................... None
See application file for complete search history.

(56) References Cited

U.S. PATENT DOCUMENTS

| | | | | |
|---|---|---|---|---|
| 4,848,090 A * | 7/1989 | Peters | ............................... | 62/3.3 |
| 5,450,017 A * | 9/1995 | Swart | ....................... | 324/754.08 |
| 6,127,835 A * | 10/2000 | Kocher et al. | ............ | 324/750.25 |
| 6,489,791 B1 * | 12/2002 | Tsujii | ....................... | 324/756.02 |
| 6,724,213 B2 * | 4/2004 | Ito et al. | ................... | 324/756.07 |
| 6,924,636 B2 * | 8/2005 | Siade et al. | ............. | 324/756.02 |
| 7,138,811 B1 * | 11/2006 | Mahoney et al. | ........ | 324/750.14 |
| 7,202,677 B2 * | 4/2007 | Pedersen et al. | ......... | 324/756.02 |
| 7,218,095 B2 * | 5/2007 | Hill | ............. | 324/750.27 |
| 7,356,742 B2 * | 4/2008 | Aoki et al. | ..................... | 714/719 |
| 7,474,113 B2 * | 1/2009 | Jain | .......................... | 324/754.01 |
| 7,737,715 B2 * | 6/2010 | Tilbor et al. | ............. | 324/762.02 |
| 2008/0174326 A1 * | 7/2008 | Jeon et al. | ..................... | 324/754 |

FOREIGN PATENT DOCUMENTS

JP    A-09-043312    2/1997

* cited by examiner

*Primary Examiner* — Richard Isla Rodas
(74) *Attorney, Agent, or Firm* — Posz Law Group, PLC

(57) ABSTRACT

A test section unit provided to a test head body includes a plurality of sockets to be attached with electronic devices to be tested and a performance board as a main substrate. All of the sockets are provided with the performance board without an intervening a socket board.

13 Claims, 5 Drawing Sheets

TEST SECTION UNIT, TEST HEAD AND ELECTRONIC DEVICE TESTING APPARATUS

CROSS-REFERENCE TO RELATED APPLICATION

The present application relates to, and claims priority from, U.S. provisional application No. 61/202,373, filed on Feb. 24, 2009 and entitled TEST PART UNIT, TEST HEAD AND ELECTRONIC DEVICE TESTING APPARATUS, the contents of which are incorporated herein by reference.

TECHNICAL FIELD

The present invention relates to a test section unit provided to a test head body, a test head and an electronic device testing apparatus.

BACKGROUND

In a production process of an electronic device, such as an IC device, a testing apparatus is necessary for testing a finally produced electronic device. In such a testing apparatus, IC devices to be tested are conveyed to sockets on a test head and a test is conducted by attaching the IC devices to the sockets and bringing them to be electrically connected. IC devices are tested as above and categorized at least into good ones and defective ones.

The above test head generally comprises a test head body, wherein a signal module for processing signals is held, and a test section unit provided to the test head body.

A test section unit 400 of the related art comprises, as shown in FIGS. 4(a)-4(c) and FIG. 5, a plurality of socket boards 420 provided with a plurality of sockets 410, a performance board (PB) 430, a sub board 440 for electrically connecting the socket boards 420 and the performance board 430 and mounted with a variety of peripheral circuits, and an interface member (not shown in the figures) such as a Hifix provided between the performance board 430 and the test head body to connect the two electrically.

Note that the performance board 430 comprises a performance board plate (PB plate) 431, a performance board stiffener (PB stiffener) 432 and a performance board connector (PB connector) 433, and the PB connector 433 engages with a connector of the Hifix.

An upper end connector 441 of the sub board 440 is engaged with a connector (not shown in the figures) of the socket board 420, and a lower end connector 442 of the sub board 440 is engaged with a connector (not shown in the figures) of the performance board 430. Namely, the sub board 440 fits in the upper and lower connectors so as to be provided upright in the vertical direction with respect to the socket board 420 and the performance board 430.

However, since the test section unit 400 of the related art comprises a plurality of socket boards 420 and the performance board 430, the mechanical structure is disadvantageously complex. Also, a transmission line path between the sockets 410 (electronic devices to be tested) and the peripheral circuits on the sub board 440 is long and, moreover, the socket boards 420 are divided to two or more; so that electric characteristics, such as high frequency transmission and a current capacity, are not always favorable. Furthermore, a size of the sub board 440 to be provided upright vertically with respect to the socket boards 420 and the performance board 430 is limited due to the structure of the handler and the number of sub boards 440 cannot be increased easily, as well.

Therefore, it is difficult to increase a mounting area of the peripheral circuits (circuit area).

SUMMARY

An object of the present invention is to provide a test section unit, a test head and an electronic device testing apparatus, wherein the mechanical structure is simple, excellent electric characteristics can be obtained and the circuit area can be easily increased.

To attain the above object, firstly, the present invention provides a test section unit provided to a test head body, comprising a plurality of sockets to be attached with electronic devices to be tested; and a performance board as a main substrate; wherein all of the plurality of sockets are provided with the performance board without intervening a socket board (Invention 1).

According to the above invention (Invention 1), a socket board of the related art is not provided and a performance board is enough, therefore, there is an advantage that the mechanical structure is simple. Also, since a socket board of the related art is not provided, peripheral circuits can be arranged close to the sockets (electronic devices to be tested) and a transmission line path between the sockets (electronic devices to be tested) and the peripheral circuits can become short, so that excellent electric characteristics such as high frequency transmission and current capacity etc. can be realized.

In the above invention (Invention 1), the performance board is preferably one board (Invention 2).

According to the above invention (Invention 2), there is an advantage that the mechanical structure is simpler.

In the above invention (Invention 1), the test section unit may be provided directly to the test head body (Invention 3). Alternately, the test section unit may be provided to the test head body through an interface member (Invention 4).

In the above invention (Invention 1), circuits generating much heat are preferably mounted on the performance board (Invention 5), and a sub board mounted with peripheral circuits may be electrically connected to said performance board (Invention 6).

According to the above invention (Invention 6), when not all of the peripheral circuits can be mounted on the performance board, the peripheral circuits can be mounted on the sub board.

In the above invention (Invention 6), preferably, the sub board is provided on the opposite side of the sockets on the performance board (Invention 7), and is provided in parallel with the performance board (Invention 8). Furthermore, one or more sub boards may be stacked for the performance board (Invention 9), in that case, preferably, the performance board and the sub board, or two sub boards are electrically connected by using a stacking connector (Invention 10).

According to the above invention (Inventions 7 to 10), since a desired number of sub boards can be stacked for the performance board in accordance with need, the circuit area can be easily increased comparing with the case of providing sub boards upright vertically with respect to the performance board. Moreover, the transmission line path between the sockets (electronic devices to be tested) and the peripheral circuits does not become long, so that excellent electric characteristics can be maintained. Note that the present invention does not exclude those with an upright sub board provided vertically with respect to the performance board.

In the above invention (Invention 1), the performance board preferably comprises a performance board plate (PB plate), a performance board stiffener (PB stiffener) and a performance board connector (PB connector) (Invention 11). In that case, the PB connector preferably engages with a connector of the test head body or a connector of an interface member (Invention 12).

Secondarily, the present invention provides a test head, comprising a test head body; and the test section unit as set forth in any one of claims 1 to 12 provided to the test head body (Invention 13).

In the above invention (Invention 13), the test section unit may be provided directly to the test head body (Invention 14). Alternately, the test section unit may be provided to the test head body through an interface member (Invention 15).

Thirdly, the present invention provides an electronic device testing apparatus, comprising the test head as set forth in claim 13; and an electronic device handling apparatus (a handler) for handling electronic devices to be tested and attaching the electronic devices to the sockets on the test head (Invention 16).

The test section unit according to the present invention has a simple mechanical structure and excellent electric characteristics, and a circuit area can be increased easily by using the test section unit according to the present invention.

DETAILED DESCRIPTION

Below, embodiments of the present invention will be explained in detail based on the drawings.

Figure 1:
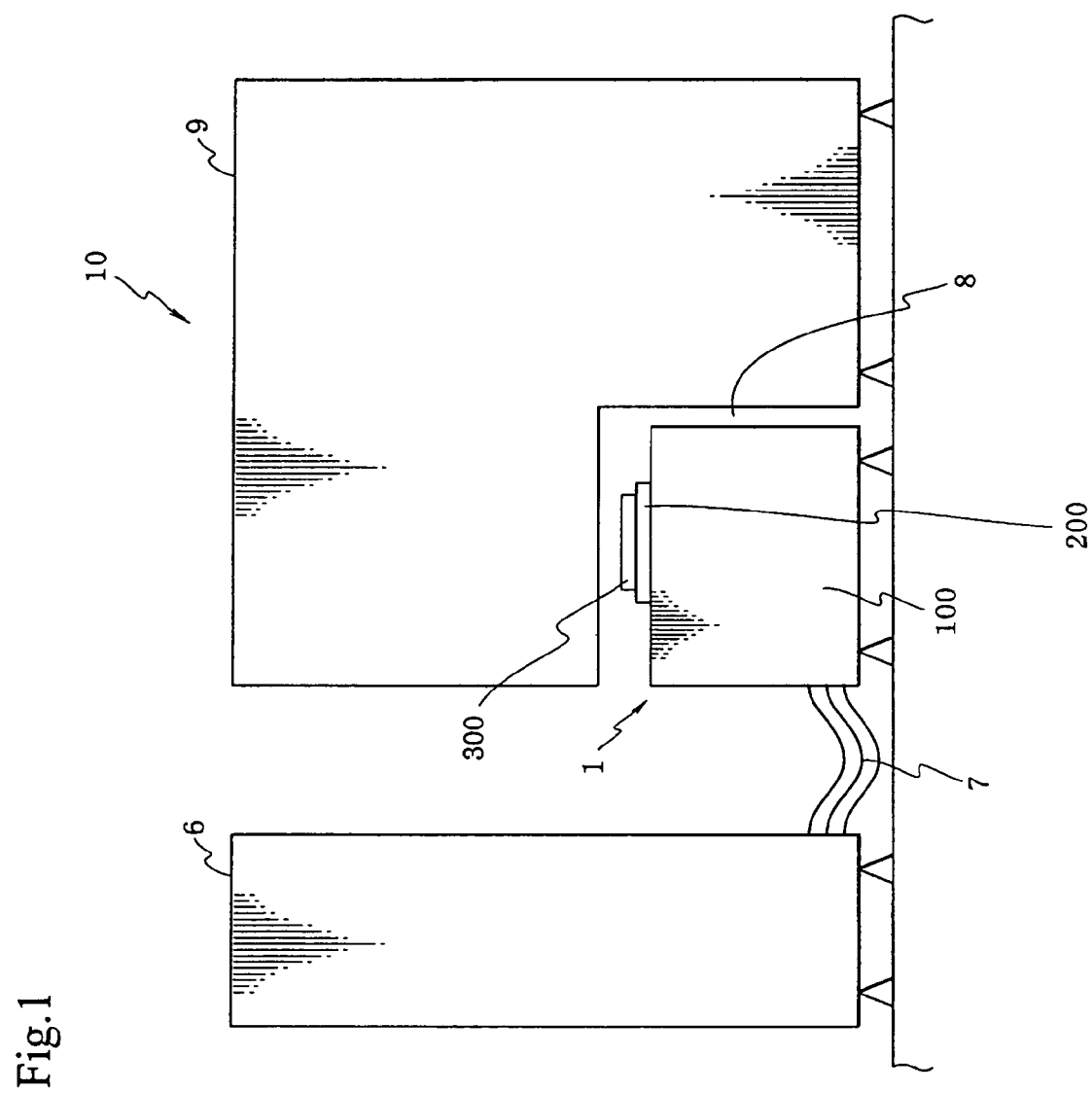
FIG. 1 is a side view of an electronic device testing apparatus according to an embodiment of the present invention.
Figure 2:
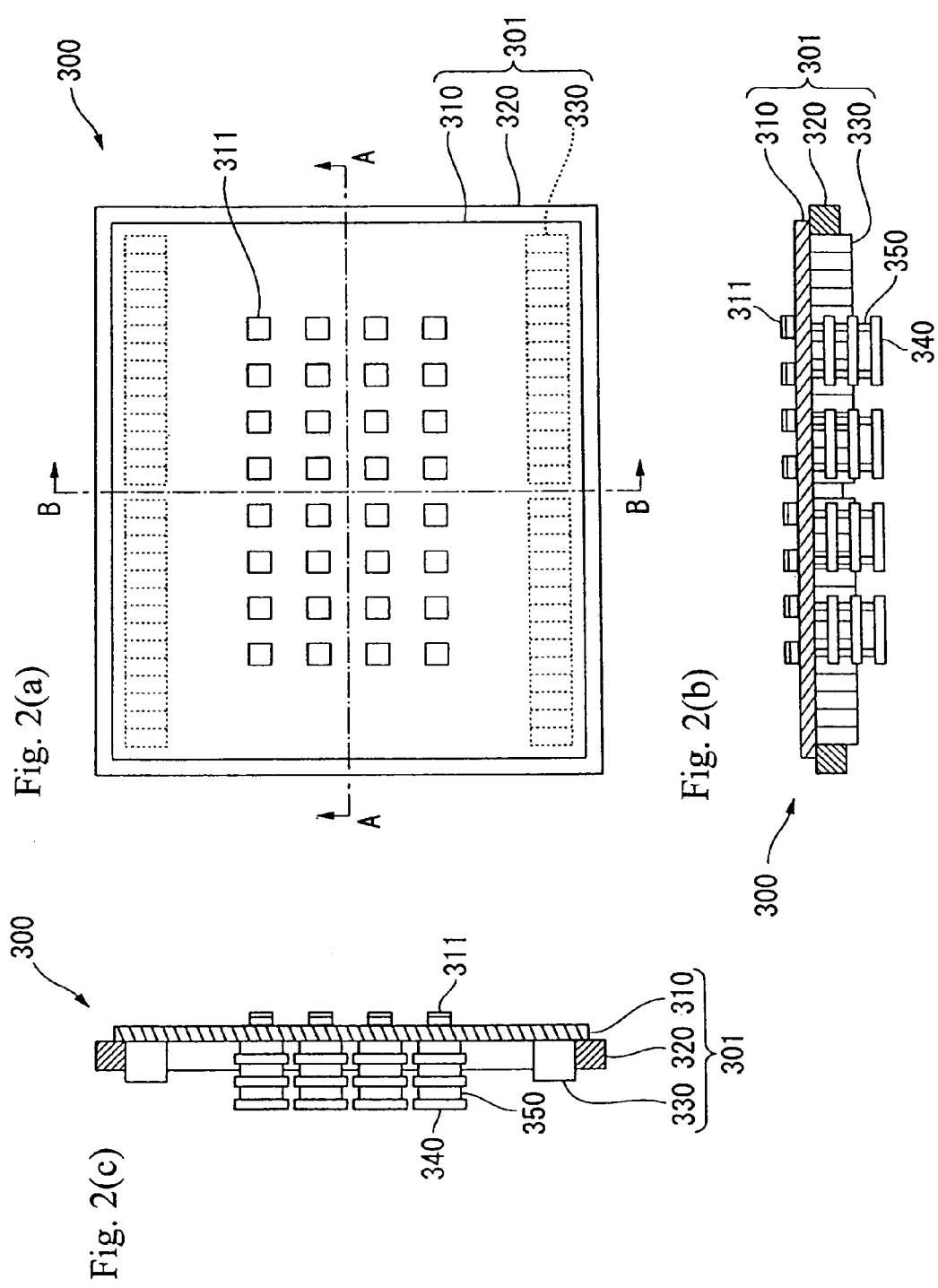
FIG. 2(a) is a plan view of a test section unit according to the same embodiment.
FIG. 2(b) is a cross-sectional front view (along the A-A line) of the same.
FIG. 2(c) is a cross-sectional side view (along the B-B line) of the same.
Figure 3:
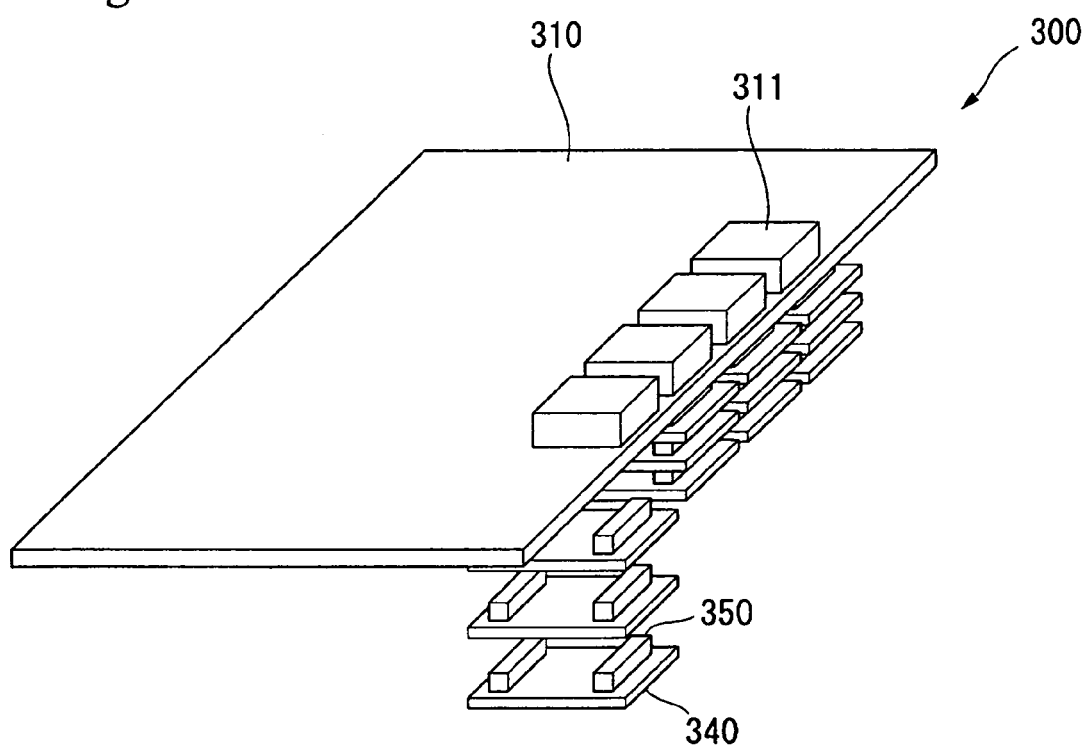
FIG. 3 is a schematic perspective view of the test section unit according to the same embodiment.
Figures 4A, 4B, 4C:
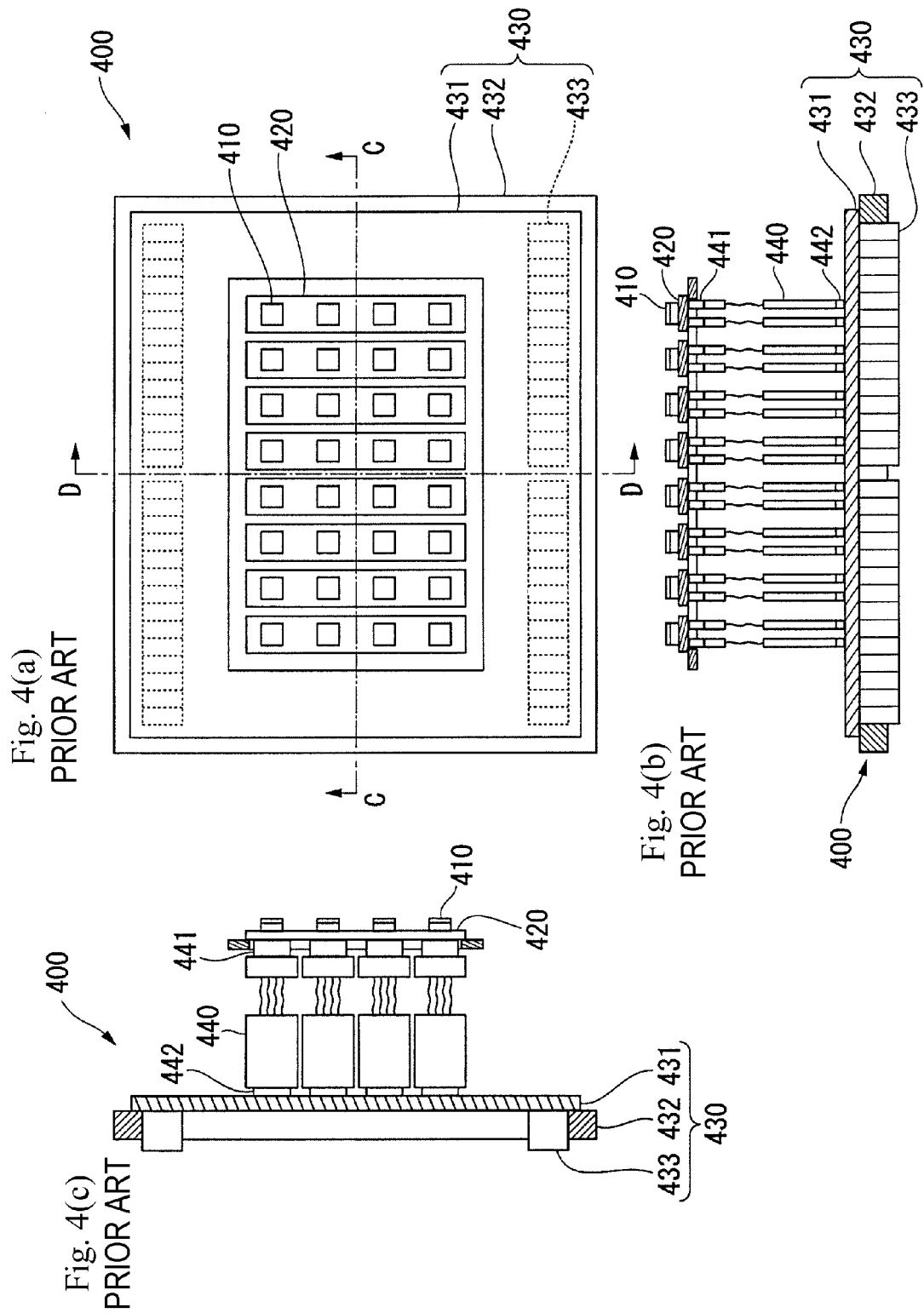
FIG. 4(a) is a plan view of a test section unit of the related art.
FIG. 4(b) is a cross-sectional front view (along the C-C line) of the same.
FIG. 4(c) is a cross-sectional side view (along the D-D line) of the same.
Figure 5:
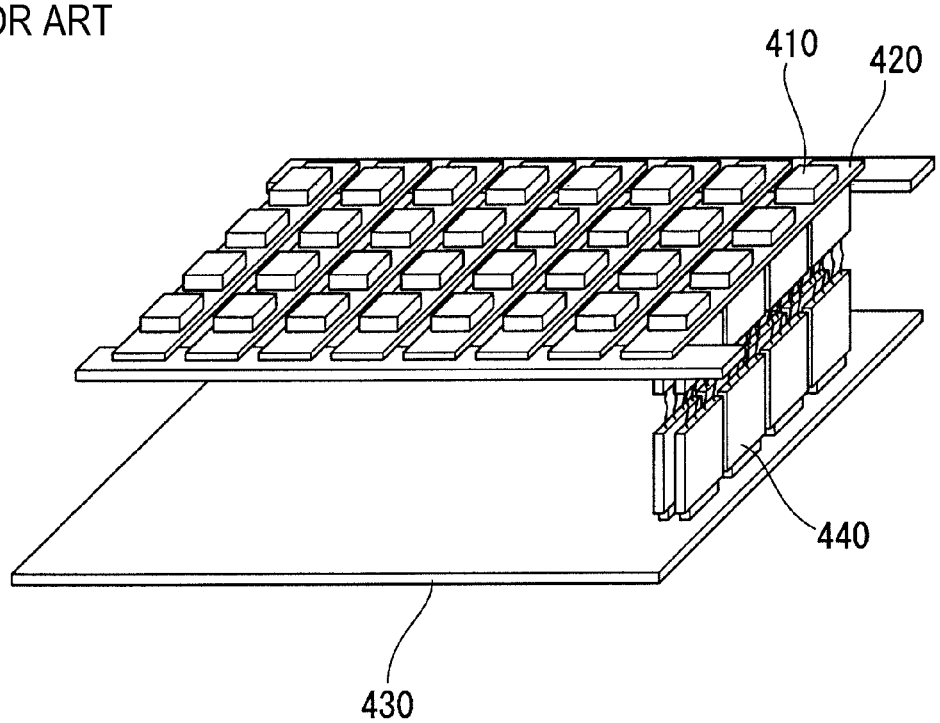
FIG. 5 is a schematic perspective view of the test section unit of the related art.

FIG. 1 is a side view of an electronic device testing apparatus according to an embodiment of the present invention; FIG. 2(a) is a plan view of a test section unit according to an embodiment of the present invention, FIG. 2(b) is a sectional front view (along the A-A line) of the same, and FIG. 2(c) is a sectional side view (along the B-B line) of the same; FIG. 3 is a schematic perspective view of the test section unit according to the same embodiment.

As shown in FIG. 1, the electronic device testing apparatus 10 according to the present embodiment comprises a handler 9, a test head 1 and a main testing device 6. The handler 9 performs operations of successively conveying IC devices (an example of electronic devices) to be tested to a plurality of IC sockets 311 provided to the test head 1, classifying tested IC devices based on the test results, and storing on predetermined trays.

On the test head 1, IC socket 311 is provided as described hereinafter (See FIGS. 2(a)-2(c)). The IC socket 311 provided to the test head 1 is electrically connected to the main testing device 6 through a cable 7, and the IC devices attached on the IC socket 311 in a removable way are brought to be connected to the main testing device 6 through the cable 7 to conduct a test on the IC devices by a testing electric signal from the main testing device 6.

Below the handler 9, there is a built-in control device for mainly controlling the handler 9 by partially leaving a space portion 8. The test head 1 is placed in the space portion 8 so as to be freely replaceable, and IC devices can be attached to the IC socket 311 on the test head 1 through through-holes formed on the handler 9.

As shown in FIG. 1, the test head 1 comprises a test head body 100 for inputting and outputting the testing electric signals, a test section unit 300 provided with a plurality of IC sockets 311 to be attached with IC devices in a removable way and a interface member 200 for electrically connecting the test head body 100 with the test section unit 300.

The test head body 100 holds a signal module (not shown in the figures) for processing the testing electric signal, and a connector (not shown in the figures) electrically connected to the signal module is provided on the upper surface of the test head body 100.

The interface member 200 is placed on the test head body 100. On the upper surface and lower surface of the interface member 200, connectors (not shown in the figures) electrically connected to each other are provided. The interface member 200 is electrically connected to the test head body 100, by engaging the connector provided on the lower surface of the interface member 200 with the connector provided on the upper surface of the test head body 100.

Note that the interface member 200 is called, for example, as a Hifix, a test head chassis, a test fixture or a top plate.

The test section unit 300 is placed on the interface member 200. As shown in FIGS. 2(a)-2(c) and FIG. 3, the test section unit 300 comprises the plurality of IC sockets 311 to be attached with IC devices in a removable way and only one performance board 301 as a main substrate. All of the plurality of IC sockets 311 are provided with the performance board 301 without intervening socket boards that exist in the related art. Note that the performance board 301 is called, for example, as a road board or a circuit board.

As shown in the FIGS. 2(a)-2(c) and FIG. 3, the performance board 301 comprises a performance board plate (PB plate) 310 provided with the IC sockets 311, a performance board stiffener (PB stiffener) 320 provided on the lower side of the PB plate 310 to support and fix the PB plate 310 and a performance board connector (PB connector) 330 provided on the lower side of the PB plate 310 and electrically connected to the IC sockets 311.

The performance board 301 and therefore the IC socket 311 is electrically connected to the test head body 100 through the interface member 200, by engaging the PB connector 330 with the connector provided on the upper surface of the interface member 200.

The plurality of IC sockets 311 are provided in the nearly center of the upper surface of the PB plate 310, and in the present embodiment, a total of 32 (thirty two) IC sockets 311 is provided on the PB plate 310 in 4 (four) columns and 8 (eight) rows.

On the PB plate 310, for example, circuits generating much heat (relay driver), etc. are preferentially mounted, and other peripheral circuits, such as variety-dependent circuits, are mounted when there is a room on the mounting area. When not all of the peripheral circuits can be mounted on the PB plate 310, a sub board 340 may be used as shown in the present embodiment.

In the present embodiment, one or more sub boards 340 are provided on the lower side of the PB plate 310 (on the opposite side of the IC sockets 311 on the PB plate 310), and provided in parallel with the PB plate 310 and stacked for the PB plate 310 by using a stacking connector 350. Each sub boards 340 are electrically connected to the vertically adjacent PB plate 310 and/or the other sub boards 340 through the stacking connector 350. In the present embodiment, a total of 48 (forty eight) sub boards 340 is stacked by using the stacking connector 350 in 4 (four) columns, 4 (four) rows and 3 (three) tiers.

According to the test section unit 300 as explained above, a socket board of the related art is not provided and one performance board 301 is enough, therefore, there is an advantage that the mechanical structure is simple. Also, by mounting peripheral circuits on the PB plate 310 or the sub boards 340 located close to the IC sockets 311 to be attached with electronic devices to be tested, peripheral circuits can be arranged close to the electronic devices to be tested and a transmission line path between the electronic devices to be tested and the peripheral circuits can become short, so that excellent electronic characteristics such as high frequency transmission and current capacity etc. can be realized. Furthermore, since a desired number of sub boards 340 can be stacked for the performance board 301 in accordance with need, the circuit area can be easily increased comparing with the case of providing sub boards 340 upright vertically with respect to the performance board 301. Moreover, the transmission line path between the electronic devices to be tested and the peripheral circuits does not become long, so that excellent electric characteristics can be maintained.

The embodiments explained above are described to facilitate understanding of the present invention and is not to limit the present invention. Accordingly, respective elements disclosed in the above embodiments include all design modifications and equivalents belonging to the technical scope of the present invention.

For example, in the present embodiment, the interface member 200 relays the electrical connection between the test head body 100 and the test section unit 300, but the present invention is not limited to this and the PB connector 330 of the test section unit 300 may be connected directly to the connector of the test head body 100.

Also, when all of the necessary circuits can be mounted on the PB plate 310, the sub boards 340 may be omitted.

The above-discussed test section unit, a test head and an electronic device testing apparatus are advantageous for testing an electronic device, such as an IC device.

The invention claimed is:

1. A test section unit provided to a test head body, comprising:
    a plurality of sockets to be attached with electronic devices to be tested; and
    a performance board as a main substrate;
    wherein all of said plurality of sockets are provided with said performance board without an intervening socket board,
    a plurality of sub boards mounted with peripheral circuits is electronically connected to said performance board,
    said sub boards are stacked on said performance board, and
    said performance board and one of said plurality of sub boards, or two of said plurality of sub boards are electrically connected by using a stacking connector.

2. The test section unit as set forth in claim 1, wherein said performance board is one board.

3. The test section unit as set forth in claim 1, wherein said test section unit is provided directly to said test head body.

4. The test section unit as set forth in claim 1, wherein said test section unit is provided to said test head body through an interface member.

5. The test section unit as set forth in claim 1, wherein circuits generating much heat are mounted on said performance board.

6. The test section unit as set forth in claim 1, wherein one of said plurality of sub boards is provided on the opposite side of said sockets on said performance board.

7. The test section unit as set forth in claim 1, wherein one of said plurality of sub boards is provided in parallel with said performance board.

8. The test section unit as set forth in claim 1, wherein said performance board comprises a performance board plate, a performance board stiffener and a performance board connector.

9. The test section unit as set forth in claim 8, wherein said performance board connector engages with a connector of the test head body or a connector of an interface member.

10. A test head, comprising:
    a test head body; and
    the test section unit as set forth in claim 1 provided to said test head body.

11. The test head as set forth in claim 10, wherein said test section unit is provided directly to said test head body.

12. The test head as set forth in claim 10, wherein said test section unit is provided to said test head body through an interface member.

13. An electronic device testing apparatus, comprising:
    the test head as set forth in claim 10; and
    an electronic device handling apparatus for handling electronic devices to be tested and attaching said electronic devices to sockets on said test head.

* * * * *